United States Patent
Szu et al.

(10) Patent No.: US 6,749,440 B1
(45) Date of Patent: Jun. 15, 2004

(54) ELECTRICAL CONTACT WITH DUAL ELECTRICAL PATHS

(75) Inventors: Ming-Lun Szu, Tu-chen (TW); Fang-Jwu Liao, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/635,626

(22) Filed: Aug. 5, 2003

(30) Foreign Application Priority Data

Mar. 21, 2003 (TW) ...................................... 92204444 U

(51) Int. Cl.⁷ .............................................. H01R 12/00
(52) U.S. Cl. ......................................... 439/66; 439/515
(58) Field of Search ........................... 439/515, 66, 862, 439/591

(56) References Cited

U.S. PATENT DOCUMENTS

| | | | | |
|---|---|---|---|---|
| 5,437,556 A | * | 8/1995 | Bargain et al. ............... | 439/66 |
| 5,820,389 A | * | 10/1998 | Hashiguchi ................... | 439/66 |
| 5,984,693 A | * | 11/1999 | McHugh et al. ............ | 439/515 |
| 6,146,152 A | * | 11/2000 | McHugh et al. .............. | 439/66 |
| 6,179,624 B1 | * | 1/2001 | McHugh et al. .............. | 439/66 |
| 6,203,331 B1 | | 3/2001 | McHugh et al. | |
| 6,227,869 B1 | * | 5/2001 | Lin et al. ....................... | 439/66 |
| 6,280,254 B1 | * | 8/2001 | Wu et al. .................... | 439/515 |
| 6,296,495 B1 | | 10/2001 | Wang et al. | |

* cited by examiner

*Primary Examiner*—Gary Paumen
*Assistant Examiner*—Briggitte R. Hammond
(74) *Attorney, Agent, or Firm*—Wei Te Chung

(57) ABSTRACT

An electrical contact (1) for electrically interconnecting two electrical interfaces (31, 41) includes a retention portion (11), an extending portion extending (12) from one end of the invention, and a second engaging portion (114) extending from the other end of the retention portion. The extending portion defines first and second mating portions (122, 121) respectively at uppermost and lowermost portions thereof, for respectively engaging with the electrical interfaces. The extending portion forms a first engaging portion (125) to mate with the second engaging portion. Thus two parallel electric paths are formed between the first and second mating portions when the contact electrically mats with the two electrical interface. As a result, impedance of the contact is decreased and gain good resilient characteristics.

12 Claims, 5 Drawing Sheets

ELECTRICAL CONTACT WITH DUAL ELECTRICAL PATHS

BACKGROUND OF THE INVENTION

1. Field of the Invention

The present invention relates to an electrical contact, and more particularly to an electrical connector contact for electrically interconnecting two electrical interfaces such as contact pads of an integrated circuit (IC) package and a printed circuit board (PCB).

2. Description of the Prior Art

There are two current trends in the connector industry which pose great challenges for manufacturers: the trend toward miniaturization of socket connectors, and the trend toward increased density of arrays of electrical contacts of the socket connectors. In a typical miniaturized socket connector, each contact received in a housing of the connector is short and occupies only a limited space. Thus a spring arm of the contact is too short to provide good resilient characteristics. As a result, engagement between the connector and an associated electrical device may be unreliable.

In order to overcome the above problems, U.S. Pat. Nos. 6,203,331 and 6,296,495 provide another kind of electrical connector. Referring to FIGS. 5, 6 and 7, the connector comprises a housing 8, and a plurality of electrical contacts 9 received in the housing 8. A plurality of contact-passages 81 is defined in the housing 8, the contact-passages 81 receiving the corresponding contacts 9 therein. Each contact 9 has an inverted "U"-shaped retention portion 91, and a "U"-shaped extending portion 92 extending slantingly down from the retention portion 91. A first mating portion 922 is formed at a bottommost portion of the extending portion 92. The first mating portion 922 extends outside the corresponding contact-passage 81, for engaging a corresponding contact pad 830 on a PCB 83. A second mating portion 921 is formed at a topmost portion of the extending portion 92. The second mating portion 921 extends outside the corresponding contact-passage 81, for engaging a corresponding contact pad 820 on an IC package 82. With this structure, the extending portion 92 is relatively long, and gives the contact 9 good resilient characteristics.

However, the elongate extending portion 92 increases a length of an electric path along an "L"-shaped portion of the contact 9 between the first and second mating portions 922, 921. Thus impedance of the contact 9 is increased. Further, the contacts 9 are densely arrayed in the housing 8. As a result, much heat is generated and concentrated in the connector during operation. The connector and the IC package 82 are liable to malfunction, and may even sustain damage.

Accordingly, there is a need to provide an improved electrical contact for a connector that overcomes the above-mentioned problems.

SUMMARY OF THE INVENTION

Accordingly, a main object of the present invention is to provide an electrical contact having both low impedance and good resilient characteristics.

To fulfill the above-mentioned object, an electrical contact is provided according to the present invention, for electrically interconnecting with two electrical interfaces. The contact comprises an "H"-shaped retention portion, a "U"-shaped extending portion extending slantingly down from one end of the retention, and a second engaging portion extending upwardly from an opposite end of the retention. First and second mating portions are formed at topmost and bottommost portions of the extending portion, for respectively engaging with the electrical interfaces.

With this structure, the extending portion of the contact is relatively long, and gives the contact good resilient characteristics. Additionally, a first engaging portion is formed on the extending portion, for engaging the second engaging portion. Thus two parallel electric paths are formed between the first and second mating portions when the contact electrically mats with the two electrical interfaces. As a result, impedance of the contact is decreased.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
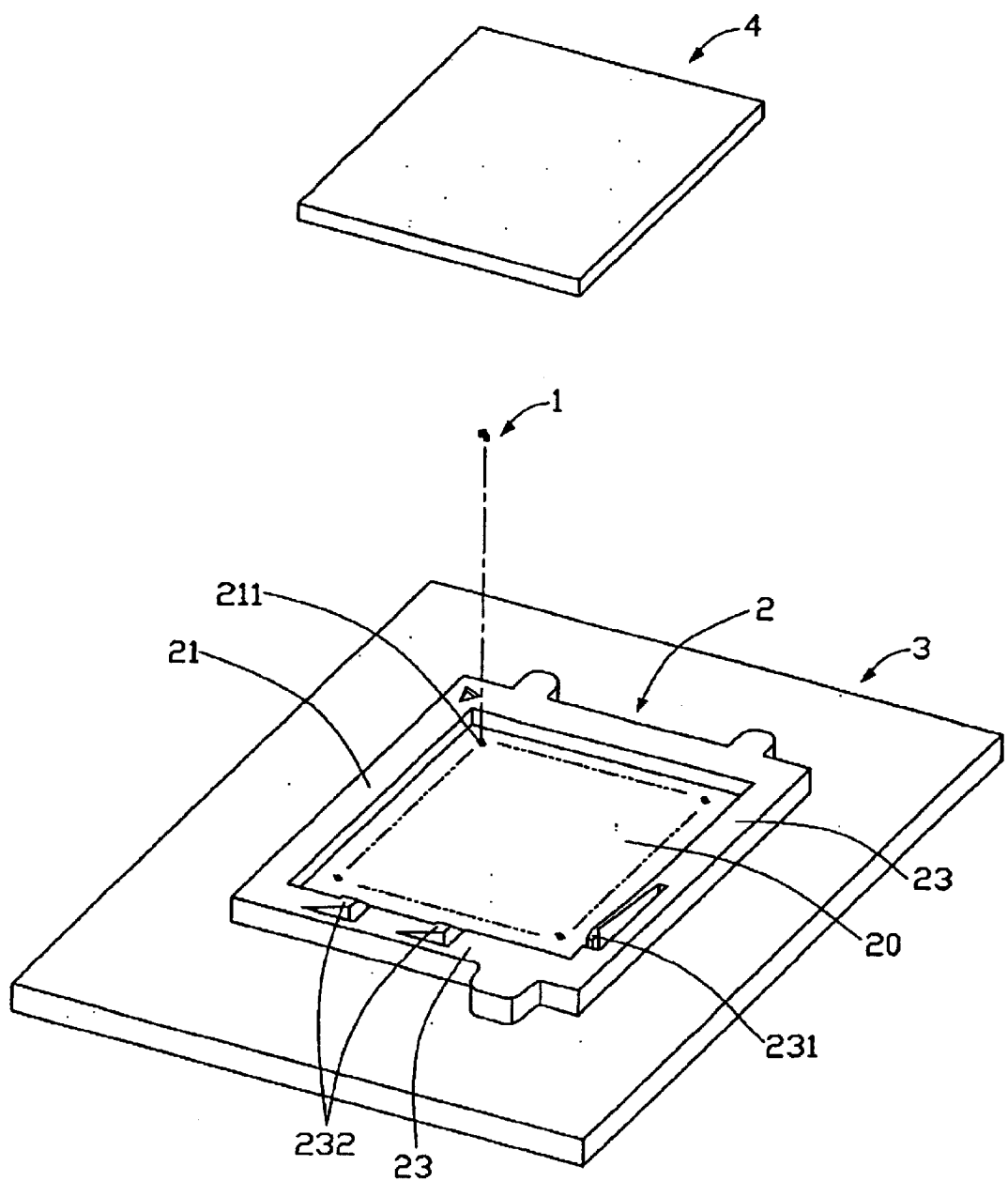
FIG. 1 is a simplified, isometric view of an electrical connector comprising electrical contacts according to the present invention, together with a PCB on which the connector is mounted, and an IC package ready to be attached to the connector.
Figure 4:
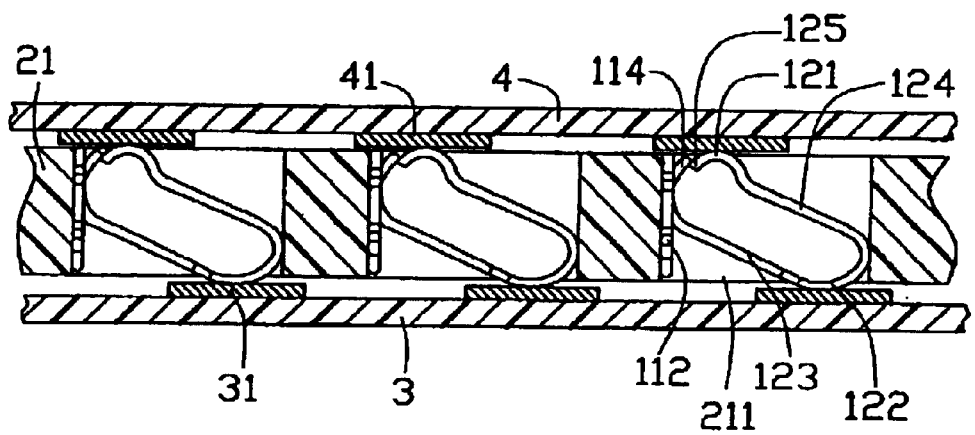
FIG. 4 is similar to FIG. 3, but also showing the IC package and the PCB connected with the connector, the IC package and the PCB being shown in cross-section.
Figure 5:
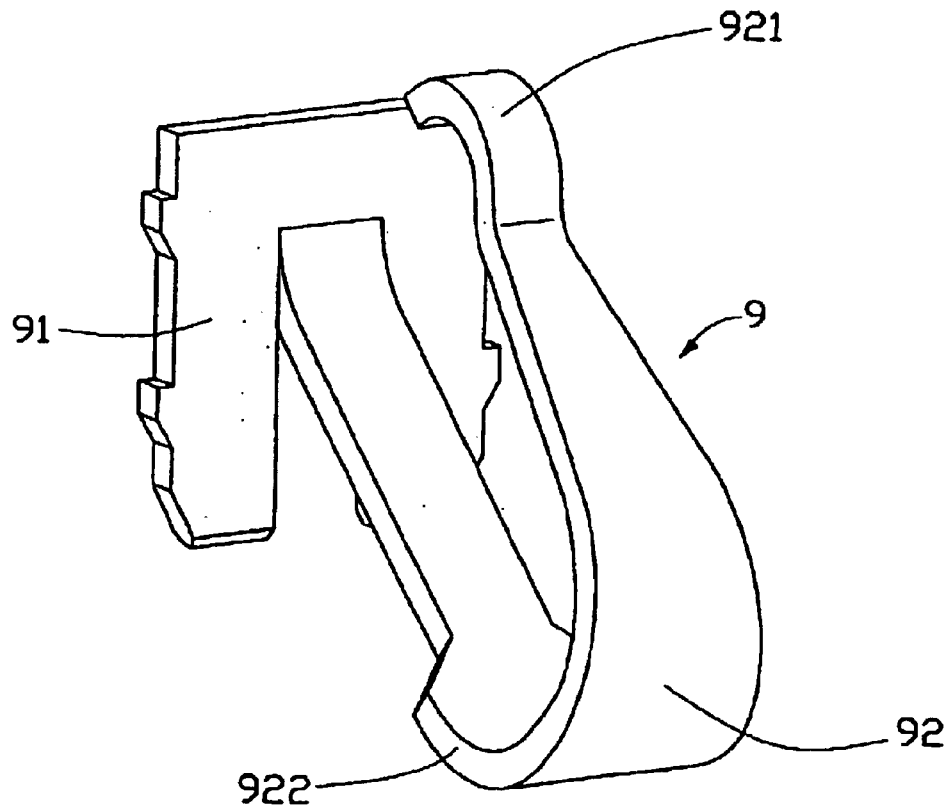
FIG. 5 is an enlarged, isometric view of a conventional electrical contact.
Figure 6:
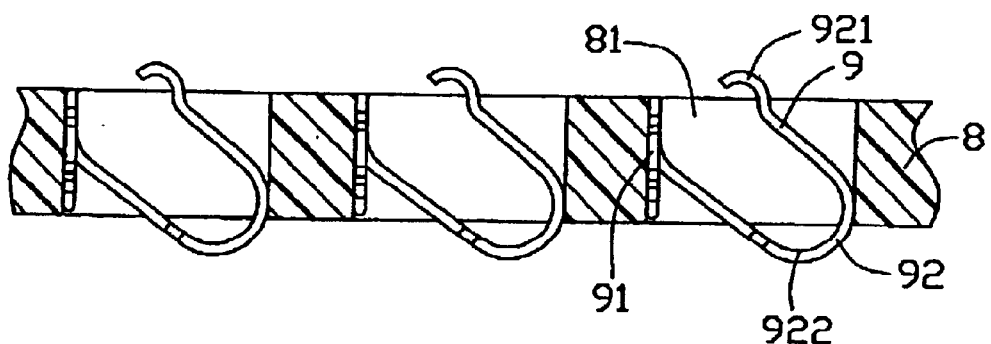
FIG. 6 is a cross-sectional view of part of a housing of a conventional connector, showing contacts in accordance with the contact of FIG. 5 received in contact-passages of the housing.
Figure 7:
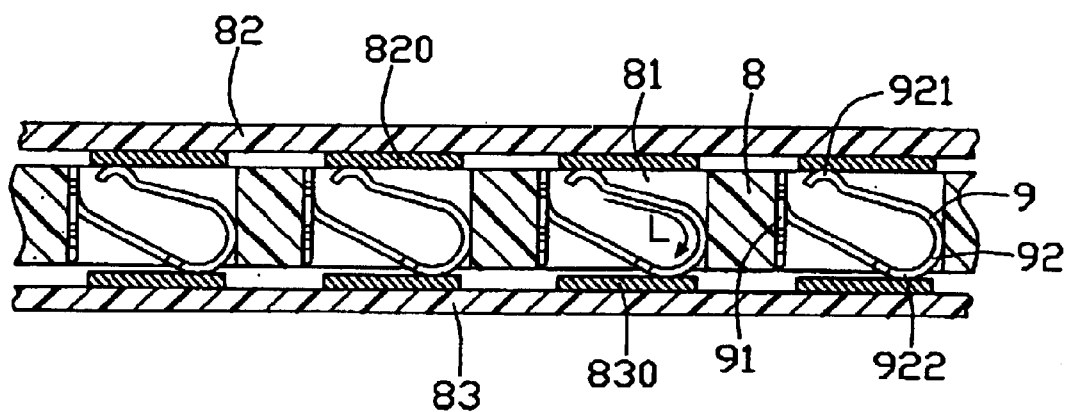
FIG. 7 is similar to FIG. 6, but also showing an IC package and a PCB connected with the connector, the IC package and the PCB being shown in cross-section.

FIG. 1 shows a simplified, isometric view of an electrical connector 2 incorporating a plurality of electrical contacts 1 according to the present invention. Referring also to FIG. 4, the electrical connector 2 is for electrically interconnecting two electrical interfaces, such as contact pads 31, 41 on a PCB 3 and on an IC package 4 respectively. The electrical connector 2 comprises a generally rectangular housing 21, and the electrical contacts 1 received in the housing 21.

The housing 21 has four side walls 23, which cooperatively define an opening 20 therebetween. An array of contact-passages 211 is defined in the housing 21 below the opening 20, the contact-passages 211 receiving the corresponding contacts 1 therein. A first spring cantilever 231 extends from an inner side of one side wall 23 into the opening 20. Two spaced second spring cantilevers 232 extend from an inner side of an adjacent side wall 23 into the opening 20. The first and second spring cantilevers 231, 232 are adapted to resiliently secure the IC package 4 in the opening 20 of the housing 21. A plurality of posts (not shown) is formed on a bottom surface of the housing 21. A plurality of holes (not shown) is defined in the PCB 3, the holes receiving the corresponding posts therein so as to position the electrical connector 2 on the PCB 3.

Figure 2:
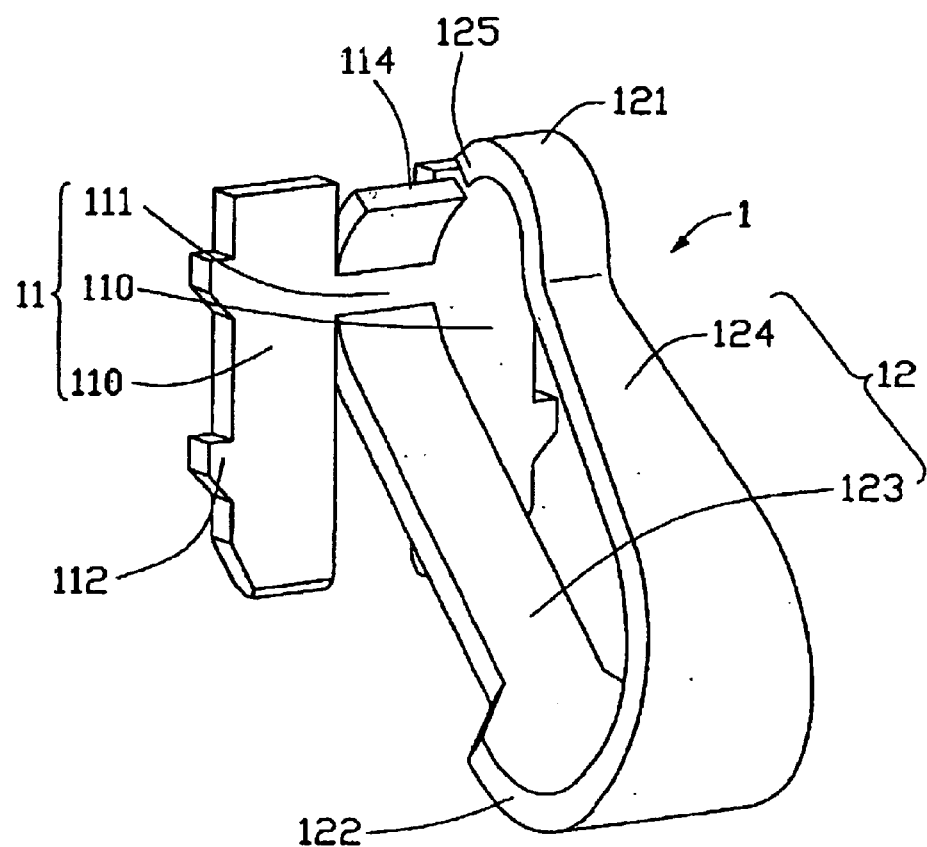
FIG. 2 is an enlarged, isometric view of one contact shown in FIG. 1.

Referring to FIG. 2, each contact 1 comprises an "H"-shaped retention portion 11. The retention portion 11 comprises two opposite parallel retention legs 110 interconnected by a transverse connecting portion 111. A plurality of protruding barbs 112 is formed on an outer longitudinal edge of each leg 110, for securing the contact 1 in a corresponding contact-passage 211.

A generally "U"-shaped extending portion 12 extends slantingly down from a bottom of the connecting portion 111. The extending portion 12 comprises opposite first and second spring arms 123, 124. The first spring arm 123 extends slantingly down from the bottom of the connecting portion 111. A first mating portion 122 is formed at a bottommost portion of the first spring arm 123, for engaging with a corresponding pad 31 of the PCB 3. The second spring arm 124 extends slantingly up from the first mating portion 122 of the first spring arm 123. A second mating portion 121 is formed at a topmost portion of the second spring arm 124, for engaging with a corresponding pad 41 of the IC package 4. In addition, a first engaging portion 125 is formed at a free end of the second spring arm 124, adjacent the second mating portion 121.

An arcuate second engaging portion 114 extends upwardly from a top of the connecting portion 111. The second engaging portion 114 bends generally toward the extending portion 12, for engaging with the first engaging portion 125 of the second spring arm 124.

With this structure, the extending portion 12 of the contact 1 is relatively long, giving the contact 1 good resilient characteristics.

Figure 3:
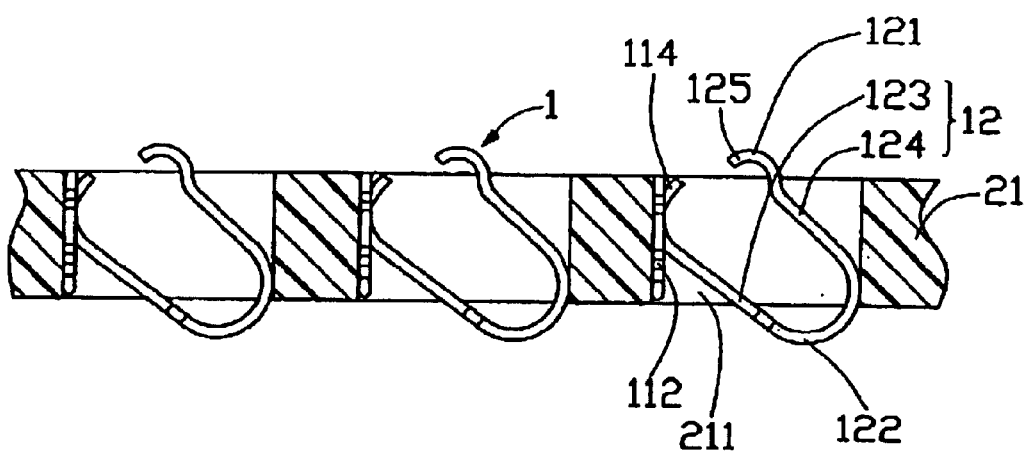
FIG. 3 is a cross-sectional view of part of a housing of the connector of FIG. 1, showing contacts received in contact-passages of the housing.

Referring to FIG. 3, in assembly of the electrical connector 2, the contacts 1 are received in the corresponding contact-passages 211 of the housing 21. The barbs 112 of each contact 1 interferingly engage with interior surfaces of the housing 21 at the contact-passage 211, so that the contact 1 is firmly secured in the contact-passage 211. The first mating portion 122 protrudes below the contact-passage 211, for engaging with the corresponding pad 31 of the PCB 3. The second mating portion 121 protrudes above the contact-passage 211, for engaging with the corresponding pad 41 of the IC package 4.

Referring to FIG. 4, in use, the pads 31, 41 of the PCB 3 and the IC package 4 respectively press the first and second mating portions 122, 121 of the contact 1 in opposite directions. Due to the good resilient characteristics of the contact 1, relatively little pressing force needs to be applied. The first and second spring arms 123, 124 are resiliently deformed, and provide the needed contact force such that the first and second mating portions 122, 121 engage with the pads 31, 41 of the PCB 3 and the IC package 4 respectively. As a result, reliable electrical connection between the PCB 3 and the IC package 4 is provided.

Simultaneously, the first engaging portion 125 engages with the second engaging portion 114, so that two parallel electrical paths are respectively formed between the first and second mating portions 122, 121. A combined impedance of the two electric paths is less than an impedance of either of the electrical paths in isolation. Thus an overall impedance of the contact 1 is reduced. When the electrical connector 2 is working, relatively little heat is generated in the contacts 1. As a result, safe operation of the IC package 4 and the electrical connector 2 is enhanced.

In addition, although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. An electrical contact for electrically connecting two electrical interfaces, the contact comprising:

a retention portion;

an extending portion extending slantingly down from the retention portion, the extending portion defining a first and an second mating portions for respectively engaging the electrical interfaces, the extending portion defining a first engaging portion; and a second engaging portion extending slantingly up from the retention portion for mating with the first engaging portion in order to form two electric circuit paths between the first and second mating portions when the contact electrically mates with the two electrical interfaces.

2. The electrical contact of claim 1, wherein the first engaging portion is disposed at a free end of the extending portion.

3. The electrical contact of claim 2, wherein the retention portion has two separated legs, and a connecting portion connecting the two legs.

4. The electrical contact of claim 3, wherein each of the two legs forms a plurality of barbs on an outer edge thereof.

5. The electrical contact of claim 1, wherein the extending portion has first and second spring arms and has a "U"-shaped configuration.

6. The electrical contact of claim 5, wherein the first spring arm extends slantingly down from the connecting portion, the first mating portion being disposed at a bottommost portion of the first spring arm.

7. The electrical contact of claim 6, wherein the second spring arm slantways upwardly extends from the first mating portion, the second mating portion being disposed at a topmost portion of the second spring arm.

8. An electrical connector for electrically connecting two electrical interfaces, the connector comprising:

a substantially rectangular housing defining a plurality of terminal-passages; and a plurality of terminals each received in a corresponding terminal-passage, each of the terminals comprising a retention portion, an engaging portion extending from one end of the retention portion, and an extending portion extending from the other end of the retention portion, the extending portion defining first and second mating portions extending respectively outside the corresponding contact-passage for engaging the two electrical interfaces;

wherein the extending portion defines engaging means to mate with the engaging portion in order to form two electric circuit paths between the first and second mating portions when the terminal electrically mates with the two electrical interfaces, wherein the retention portion has two separated legs and a connecting portion connecting the two legs, each of the legs forming a plurality of barbs on an outer edge thereof; and the extending portion has first and second spring arms and has a "U"-shaped configuration, wherein the first spring arm extends slantingly down from the connecting portion, the first mating portion being disposed at a bottommost portion of the first spring arm, the second spring arm extends upwardly from the first mating portion and the second mating portion being disposed at a topmost portion of the second spring arm.

9. The electrical connector of claim 8, wherein the engaging means is a first engaging portion is disposed at a free end of the extending portion.

10. The electrical connector of claim 9, wherein the housing defines four side walls which cooperatively define an opening therebetween.

11. The electrical connector of claim 10, wherein one of the side walls defines a first spring cantilever extending into the opening.

12. The electrical connector of claim 11, wherein the adjacent side wall defines two spaced second spring cantilevers extending into the opening.

* * * * *